United States Patent
Saito et al.

(10) Patent No.: US 7,382,216 B2
(45) Date of Patent: Jun. 3, 2008

(54) NOISE FILTER MOUNTING STRUCTURE

(75) Inventors: Kenichi Saito, Echizen (JP); Hisato Oshima, Fukui (JP); Takaaki Ooi, Nagaokakyo (JP); Toshinori Murakami, Fukui (JP); Yoshimi Tanaka, Sabae (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 220 days.

(21) Appl. No.: 10/555,674

(22) PCT Filed: Sep. 27, 2004

(86) PCT No.: PCT/JP2004/014076

§ 371 (c)(1),
(2), (4) Date: Nov. 3, 2005

(87) PCT Pub. No.: WO2005/060092

PCT Pub. Date: Jun. 30, 2005

(65) Prior Publication Data

US 2006/0274472 A1    Dec. 7, 2006

(30) Foreign Application Priority Data

Dec. 15, 2003   (JP) ............................. 2003-416045

(51) Int. Cl.
*H03H 7/01* (2006.01)
(52) U.S. Cl. ...................................... 333/181; 333/185
(58) Field of Classification Search ................ 333/181, 333/185
See application file for complete search history.

(56) References Cited

U.S. PATENT DOCUMENTS 4,320,364 A * 3/1982 Sakamoto et al. .......... 333/167
4,563,659 A * 1/1986 Sakamoto .................... 333/181
6,150,895 A * 11/2000 Steigerwald et al. .......... 333/12

FOREIGN PATENT DOCUMENTS

JP           59-015319          1/1984

(Continued)

OTHER PUBLICATIONS

Official Communication issued in corresponding Korean Patent Application No. 10-2005-7019767, dated Oct. 31, 2006.

*Primary Examiner*—Benny Lee
*Assistant Examiner*—Eric R Hamill
(74) *Attorney, Agent, or Firm*—Keating & Bennett, LLP (57) ABSTRACT

A noise filter includes a capacitor having a hot side input terminal, a hot side output terminal, a ground side input terminal, and a ground side output terminal. A circuit board includes a hot side input electrode connected to the hot side input terminal, a hot side output electrode connected to the hot side output terminal, a ground side input electrode connected to the ground side input terminal, and a ground side output electrode connected to the ground side output terminal. The impedance of the ground side input terminal seen from the ground side output electrode is larger than both the impedance of the ground side output terminal seen from the ground side output electrode and the impedance of the hot side output terminal seen from the ground side output electrode. For this purpose, a stray capacitance formed between the ground side input electrode and the ground side output electrode is reduced by increasing a gap therebetween. Accordingly, excellent noise-reducing characteristics are provided.

12 Claims, 5 Drawing Sheets

FOREIGN PATENT DOCUMENTS

| | | |
|---|---|---|
| JP | 59-204307 | 11/1984 |
| JP | 60-2652 Y2 | 1/1985 |
| JP | 60-22662 Y2 | 7/1985 |
| JP | 64-36112 | 2/1989 |
| JP | 01-15205 B2 | 3/1989 |
| JP | 01-22258 Y2 | 6/1989 |
| JP | 02-18587 Y2 | 5/1990 |
| JP | 06-31777 Y2 | 8/1994 |
| JP | 10-224175 | 8/1998 |
| JP | 2001-94376 | 4/2001 |

* cited by examiner

NOISE FILTER MOUNTING STRUCTURE

BACKGROUND OF THE INVENTION

1. Field of the Invention

The present invention relates to mounting structures for noise filters, and more particularly, to a mounting structure for a noise filter including a four-terminal capacitor.

2. Description of the Related Art

Figure 6A:
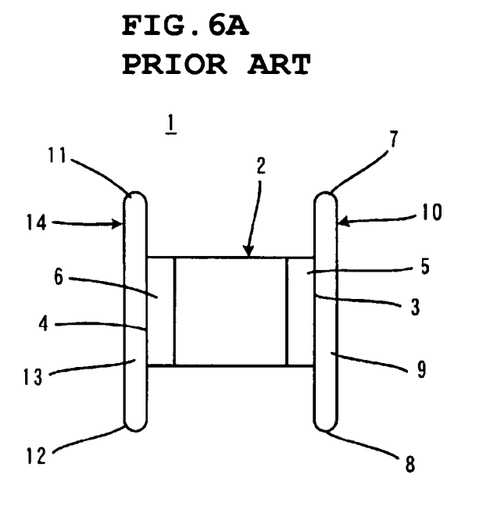
FIGS. 6(A) and 6(B) are a top view and a right side view, respectively.
Figure 6B:
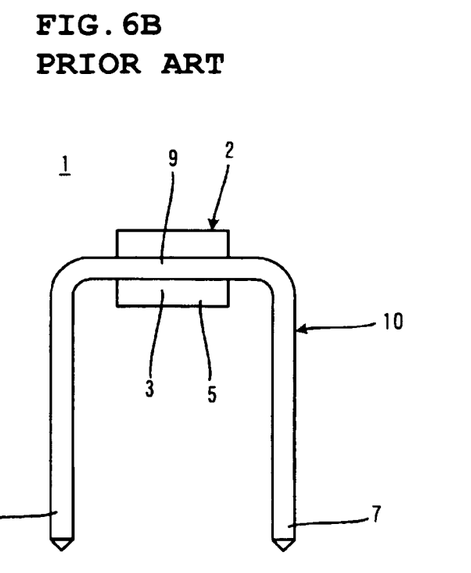

FIGS. 6(A) and 6(B) illustrate a known noise filter relevant to the present invention (see, for example, Japanese Examined Utility Model Registration Application Publication No. 1-22258, Japanese Examined Utility Model Registration Application Publication No. 2-18587, and Japanese Examined Utility Model Registration Application Publication No. 6-31777). FIGS. 6(A) and 6(B) are a top view and a right side view, respectively, of a noise filter 1.

With reference to FIGS. 6(A) and 6(B), the noise filter 1 includes a four-terminal capacitor 2. The capacitor 2 has a chip-like shape and is provided with first and second terminal electrodes 5 and 6 on first and second end surfaces 3 and 4, respectively, which extend parallel to each other so as to face each other.

In addition, as shown clearly in FIG. 6(B), the noise filter 1 includes a hot side lead 10 that is bent in a U shape in such a manner that first and second leg portions 7 and 8 extend parallel to each other and a middle portion 9 connects the first and second leg portions 7 and 8 at one end thereof.

The hot side lead 10 is connected to the first terminal electrode 5 at the middle portion 9 thereof such that the first and second leg portions 7 and 8 extend parallel to the first and second end surfaces 3 and 4 of the capacitor 2. In addition, the first and second leg portions 7 and 8 of the hot side lead 10 respectively define a hot side input terminal connected to a power source and a hot side output terminal connected to a load circuit.

In the following description, reference numeral "7" is used to denote not only the "first leg portion" but also the "hot side input terminal", and reference numeral "8" is used to denote not only the "second leg portion" but also the "hot side output terminal".

The noise filter 1 further includes a ground side lead 14 that is bent in a U shape in such a manner that first and second leg portions 11 and 12 extend parallel to each other and a middle portion 13 connects the first and second leg portions 11 and 12 at one end thereof. The leg portions 11 and 12 of the ground side lead 14 are not completely shown in FIGS. 6(A) and 6(B).

The ground side lead 14 is connected to the second terminal electrode 6 at the middle portion 13 thereof such that the first and second leg portions 11 and 12 extend parallel to the first and second end surfaces 3 and 4 of the capacitor 2, that is, parallel to the first and second leg portions 7 and 8 in the hot side lead 10. In addition, the first and second leg portions 11 and 12 of the ground side lead 14 respectively serve as a ground side input terminal connected to a power source and a ground side output terminal connected to a load circuit.

In the following description, reference numeral "11" is used to denote not only the "first leg portion" but also the "ground side input terminal". In addition, reference numeral "12" is used to denote not only the "second leg portion" but also the "ground side output terminal".

A circuit board on which the above-described noise filter 1 is mounted includes a hot input electrode connected to the hot side input terminal 7, a hot side output electrode connected to the hot side output terminal 8, a ground side input electrode connected to the ground side input terminal 11, and a ground side output electrode connected to the ground side output terminal 12.

Figure 7:
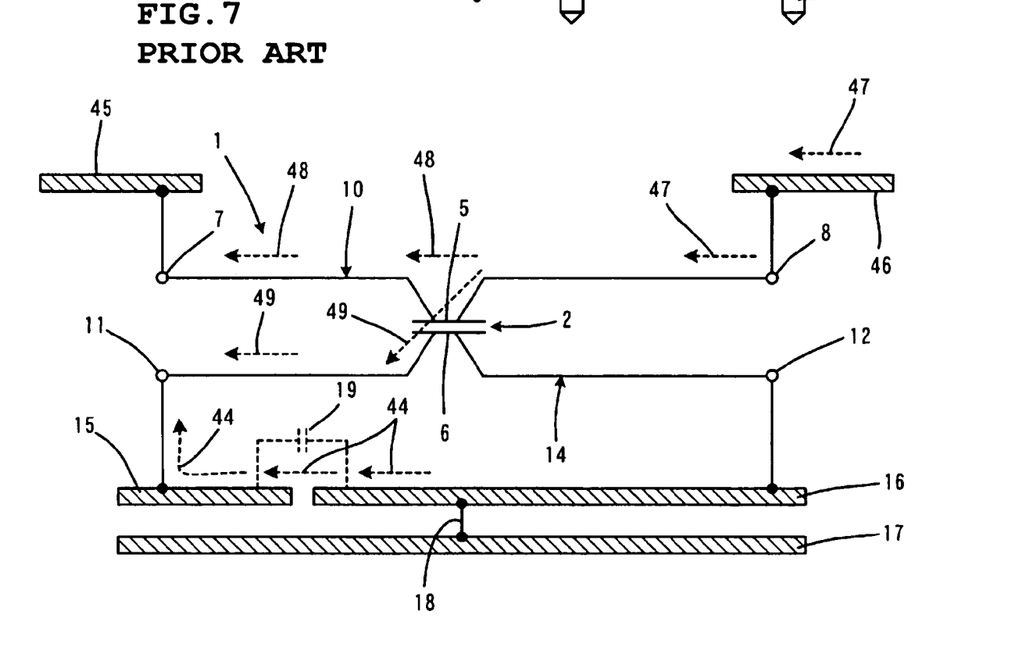
FIG. 7 is a schematic diagram illustrating an equivalent circuit of the noise filter and the manner in which hot side electrodes and ground side electrodes of a circuit board are connected when the noise filter is mounted on the circuit board.

FIG. 7 is a schematic diagram illustrating an equivalent circuit of the noise filter 1 and the manner in which the hot side electrodes and the ground side electrodes of the circuit board are connected when the noise filter 1 is mounted on the circuit board. In FIG. 7, elements in the equivalent circuit of the noise filter 1 that correspond to the elements shown in FIGS. 6(A) and 6(B) are denoted by the same reference numerals in order to clarify the correspondence between the elements shown in FIG. 7 and those shown in FIGS. 6(A) and 6(B).

FIG. 7 shows a hot side input electrode 45 connected to the hot side input terminal 7, a hot side output electrode 46 connected to the hot side output terminal 8, a ground side input electrode 15 connected to the ground side input terminal 11, and a ground side output electrode 16 connected to the ground side output terminal 12. Although the overall body of the circuit board is not illustrated, the hot side input electrode 45, the hot side output electrode 46, the ground side input electrode 15, and the ground side output electrode 16 are provided on the circuit board.

The above-described circuit board is typically fixed to a chassis 17 made of metal with a metal screw 18. Accordingly, the ground side output electrode 16 is electrically connected to the chassis 17 via the metal screw 18.

When the noise filter 1 shown in FIGS. 6(A), 6(B) and 7 is in operation, a noise signal is transmitted from the ground side output terminal 12 to the chassis 17 via the ground side output electrode 16 on the circuit board and the metal screw 18. At this time, since the ground side output electrode 16 and the chassis 17 are only electrically connected to each other with the metal screw 18, there may be a case where the above-described noise signal cannot be sufficiently grounded.

In addition, in the circuit board, since the ground side input electrode 15 and the ground side output electrode 16 are disposed adjacent to each other and near each other, a stray capacitance 19 shown by the dashed lines in FIG. 7 is unavoidably formed.

Therefore, the noise signal that is transmitted from the ground side output terminal 12 to the ground side output electrode 16 and is grounded as described above is transmitted to the ground side input electrode 15 via the stray capacitance 19, as shown by the dashed arrows 44, and is then transmitted to the ground side input terminal 11, which reduces the noise reduction effect.

In addition, when the noise filter 1 shown in FIGS. 6(A), 6(B) and 7 is in operation, the noise signal is transmitted from the hot side output terminal 8 to the ground side output terminal 12 via the capacitor 2, as shown by the dashed arrows 47, and is then transmitted to the chassis 17 via the ground side output electrode 16 on the circuit board and metal screw 18. At this time, the impedance of the capacitor 2 at the noise frequency range may be high or the residual inductance of the ground side lead 14 may affect the noise signal as the residual impedance. In such cases, the above-described noise signal cannot be sufficiently grounded.

In the above-described situation, a portion of the noise signal transmitted from the hot side output terminal 8 to the capacitor 2 does not flow through the capacitor 2 but flows into the hot side lead 10 toward the hot side input terminal 7, as shown by the dashed arrows 48. In addition, a portion of the noise signal that flows through the capacitor 2 does not flow into the ground side lead 14 but flows toward the ground side input terminal 11, as shown by the dashed arrows 49. This also reduces the noise reduction effect.

SUMMARY OF THE INVENTION

In order to overcome the problems described above, preferred embodiments of the present invention provide a mounting structure adapted to mount a noise filter including a capacitor having a hot side input terminal, a hot side output terminal, a ground side input terminal, and a ground side output terminal onto a circuit board.

The circuit board includes a hot side input electrode connected to the hot side input terminal, a hot side output electrode connected to the hot side output terminal, a ground side input electrode connected to the ground side input terminal, and a ground side output electrode connected to the ground side output terminal.

The mounting structure includes an impedance increaser arranged to increase the impedance of the ground side input terminal seen from the ground side output electrode to be larger than both the impedance of the ground side output terminal seen from the ground side output electrode and the impedance of the hot side output terminal seen from the ground side output electrode.

According to a first preferred embodiment of the present invention, the impedance increaser includes a structure arranged to reduce a stray capacitance between the ground side input electrode and the ground side output electrode by providing a gap between the ground side input electrode and the ground side output electrode that is larger than a gap between the ground side output electrode and the hot side output electrode.

According to a second preferred embodiment of the present invention, the impedance increaser includes an inductor connected between the ground side input electrode and the ground side output electrode. The structure including the inductor that functions as the impedance increaser according to the second preferred embodiment may be used in place of or in addition to the structure for reducing the stray capacitance that functions as the impedance increaser according to the first preferred embodiment.

The noise filter to which the mounting structure of the present invention is applied preferably has the following structure.

That is, the noise filter preferably includes a hot side lead that is bent in a U shape such that first and second leg portions extend substantially parallel to each other and a middle portion connects the first and second leg portions at one end thereof, the first and second leg portions serving as the hot side input terminal and the hot side output terminal, respectively.

In addition, the noise filter preferably includes a ground side lead that is bent in a U shape such that first and second leg portions extend substantially parallel to each other and a middle portion connects the first and second leg portions at one end thereof, the first and second leg portions serving as the ground side input terminal and the ground side output terminal, respectively.

The capacitor includes first and second terminal electrodes that face each other, the hot side lead being connected to the first terminal electrode at the middle portion of the hot side lead and the ground side lead being connected to the second terminal electrode at the middle portion of the ground side lead.

According to a preferred embodiment, a ferrite bead is preferably provided at least in association with the ground side input terminal.

In addition, a feedthrough capacitor is preferably provided at least in association with the hot side output terminal.

According to a preferred embodiment, since the impedance increaser increases the impedance of the ground side input terminal, the noise signal transmitted from the ground side output terminal to the ground side output electrode is grounded and is prevented from being transmitted to the ground side input terminal via the ground side input electrode. In addition, the noise signal generated at the hot side output electrode is grounded to the ground side output electrode via the stray capacitance between the hot side output electrode and the ground side output electrode. As a result, a mounting structure for a noise filter that can provide excellent noise-reducing characteristics can be obtained.

According to the first preferred embodiment of the present invention, the impedance increaser includes the structure that reduces the stray capacitance between the ground side input electrode and the ground side output electrode by increasing the gap between the ground side input electrode and the ground side output electrode and that positively utilizes the stray capacitance between the hot side output electrode and the ground side output electrode by reducing the gap between the hot side output electrode and the ground side output electrode. Therefore, the impedance increaser can be obtained without using an additional component, more specifically, simply by changing the patterns of the ground side input electrode, the ground side output electrode, and the hot side output electrode on the circuit board.

According to a second preferred embodiment of the present invention, the impedance increaser includes the inductor connected between the ground side input electrode and the ground side output electrode. Thus, the impedance can be reliably increased simply by adding, for example, a component like a chip inductor.

In addition, when the ferrite bead is provided in association with at least the ground side input terminal, the inductance at this portion can be increased, and accordingly the noise reduction effect can be increased.

In addition, when the feedthrough capacitor is provided in association with at least the hot side output terminal, the noise reduction effect can be increased.

Other features, elements, characteristics, and advantages of the present invention will become more apparent from the following description of preferred embodiments of the present invention with reference to the attached drawings.

BRIEF DESCRIPTION OF THE DRAWINGS

FIGS. 1(A)-1(C) illustrate an external view of a noise filter to which a mounting structure according to a first preferred embodiment of the present invention is applied, where FIGS. 1(A), 1(B), and 1(C) are a top view, a front view, and a right side view, respectively.

FIGS. 2(A)-2(D) illustrate sectional views of the internal structure of the noise filter shown in FIG. 1, where

FIGS. 3(A) and 3(B) illustrate the mounting structure of the noise filter shown in FIG. 1, where

FIGS. 6(A) and 6(B) illustrate a known noise filter that is relevant to the present invention, where

DETAILED DESCRIPTION OF PREFERRED EMBODIMENTS

FIGS. 1 to 4 are diagrams for explaining a mounting structure for a noise filter according to a first preferred embodiment of the present invention.

Figure 1A:
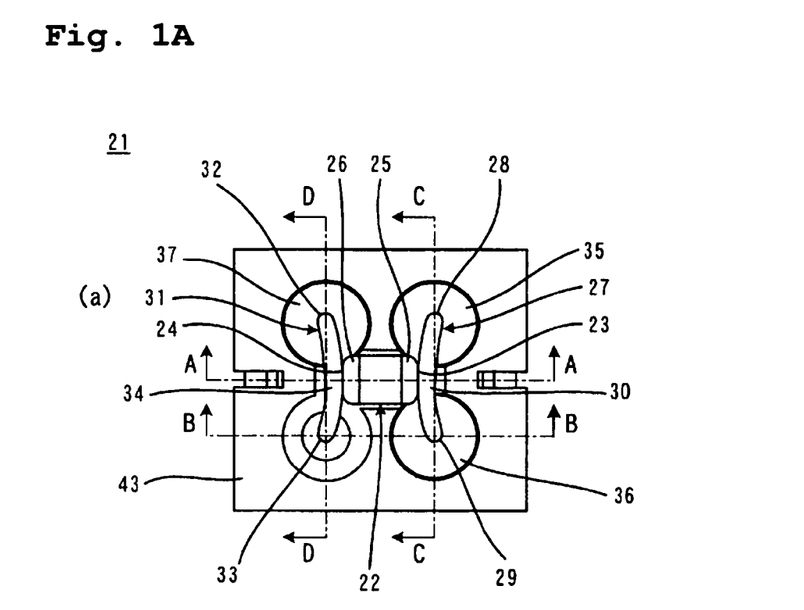
Figure 1B:
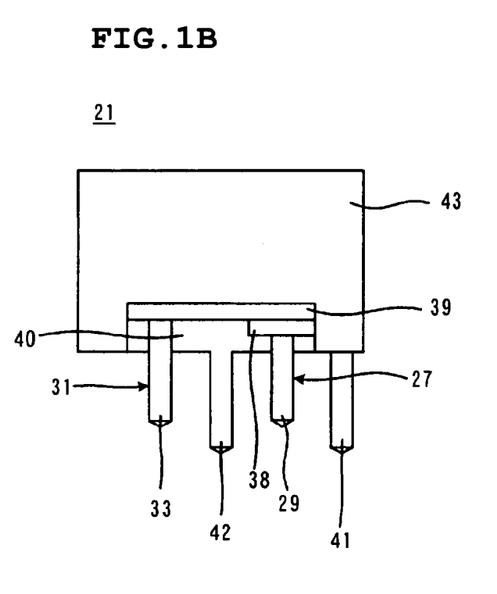
Figure 1C:
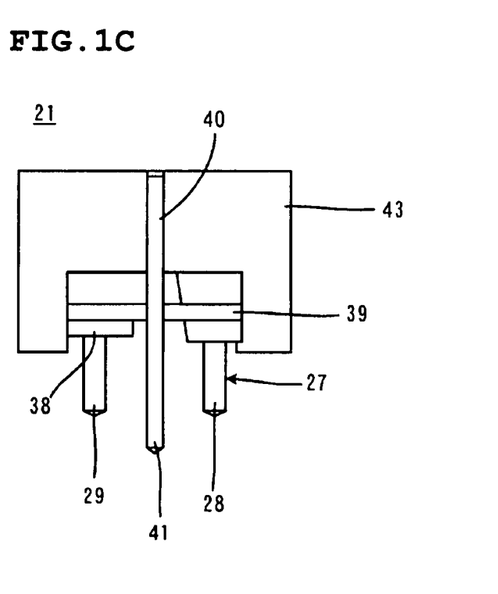

FIGS. 1(A)-(D) illustrate an external view of a noise filter 21, where FIGS. 1(A), 1(B), and 1(C) are a top view, a front view, and a right side view, respectively. FIGS. 2(A)-(D) illustrate sectional views of the internal structure of the noise filter 21, where 2(A), 2(B), 2(C), and 2(D) are sectional views taken along lines A-A, B-B, C-C, and D-D, respectively, in FIG. 1(A).

The noise filter 21 shown in the figures is an LC composite component that functions as an EMI suppression filter.

The noise filter 21 includes a capacitor 22 having a chip-like shape that functions as a four-terminal capacitor. The capacitor 22 includes, for example, a monolithic ceramic capacitor. The capacitor 22 is provided with first and second terminal electrodes 25 and 26 on first and second end surfaces 23 and 24, respectively, which extend substantially parallel to each other so as to face each other.

In addition, the noise filter 21 includes a hot side lead 27 and a ground side lead 31.

Figure 2A:
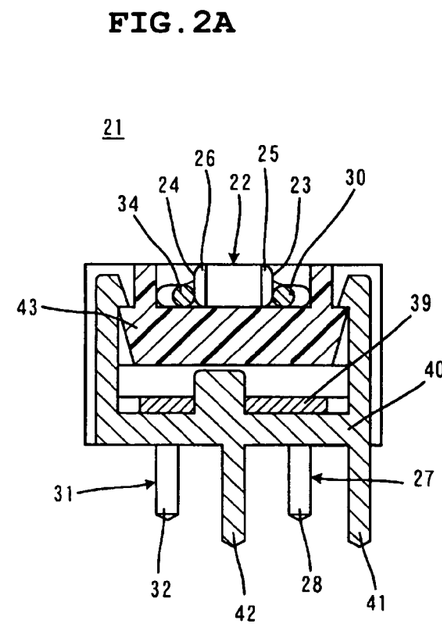
FIGS. 2(A), 2(B), 2(C), and 2(D) are sectional views taken along lines A-A, B-B, C-C, and D-D, respectively, in FIG. 1(A).
Figure 2B:
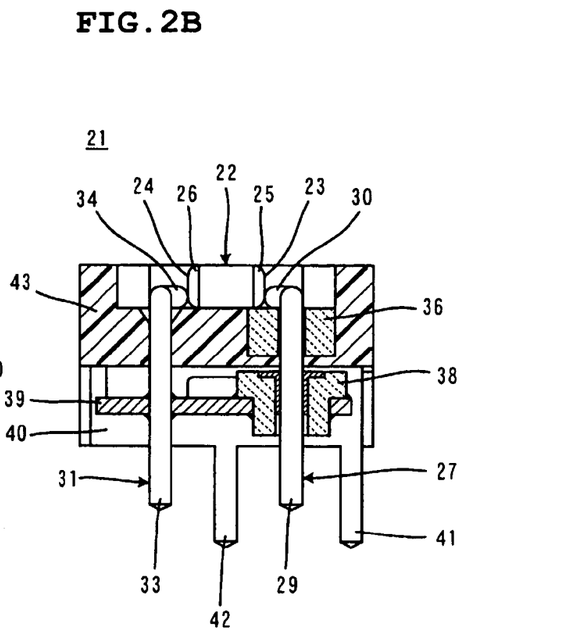
Figure 2C:
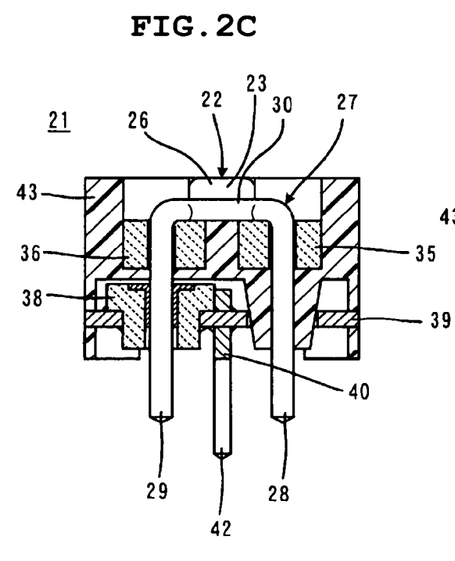

As shown clearly in FIG. 2(C), the hot side lead 27 is bent in a U shape in such a manner that first and second leg portions 28 and 29 extend substantially parallel to each other and a middle portion 30 connects the first and second leg portions 28 and 29 at one end thereof.

Figure 2D:
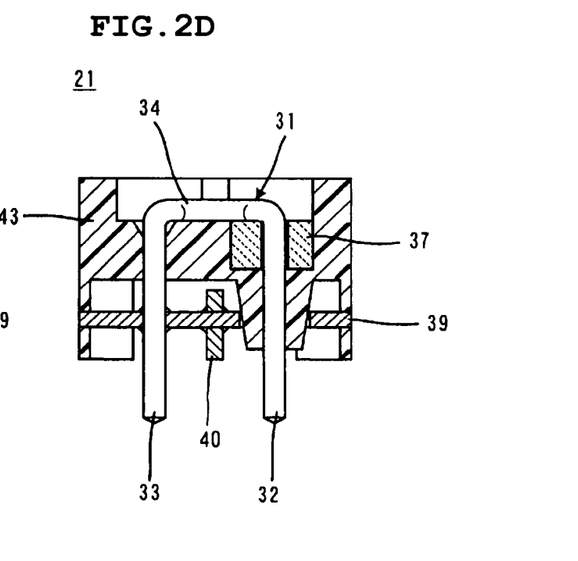

In addition, as shown clearly in FIG. 2(D), the ground side lead 31 is bent in a U shape in such a manner that first and second leg portions 32 and 33 extend substantially parallel to each other and a middle portion 34 connects the first and second leg portions 32 and 33 at one end thereof.

The hot side lead 27 is soldered to the first terminal electrode 25 at the middle portion 30 thereof such that the first and second leg portions 28 and 29 extend parallel to the first and second end faces 23 and 24 of the capacitor 22. In addition, the first and second leg portions 28 and 29 of the hot side lead 27 respectively serve as a hot side input terminal connected to a power source and a hot side output terminal connected to a load circuit.

In the following description, reference numeral "28" is used to denote not only the "first leg portion" but also the "hot side input terminal." In addition, reference numeral "29" is used to denote not only the "second leg portion" but also the "hot side output terminal."

The ground side lead 31 is soldered to the second terminal electrode 26 at the middle portion 34 thereof such that the first and second leg portions 32 and 33 extend parallel to the first and second end faces 23 and 24 of the capacitor 22, and, parallel to the first and second leg portions 28 and 29 in the hot side lead 27. In addition, the first and second leg portions 32 and 33 of the ground side lead 31 respectively serve as a ground side input terminal connected to a power source and a ground side output terminal connected to a load circuit.

In the following description, reference numeral "32" is used to denote not only the "first leg portion" but also the "ground side input terminal." In addition, reference numeral "33" is used to denote not only the "second leg portion" but also the "ground side output terminal."

In the present preferred embodiment, the middle portion 30 of the hot side lead 27 and the middle portion 34 of the ground side lead 31 are respectively bent toward the first and second end surfaces 23 and 24 of the capacitor 22. Accordingly, even when the distance between the first and second end surfaces 23 and 24 of the capacitor 22 is smaller than the distance between the hot side input terminal 28 and the ground side input terminal 32 or the distance between the hot side output terminal 29 and the ground side output terminal 33, the middle portion 30 of the hot side lead 27 can be connected to the first terminal electrode 25 of the capacitor 22 and the middle portion 34 of the ground side lead 31 can be connected to the second terminal electrode 26 by soldering or the like without using an additional component.

According to the present preferred embodiment, the middle portion 30 of the hot side lead 27 and the middle portion 34 of the ground side lead 31 are respectively connected to the first and second terminal electrodes 25 and 26 at the first and second end surfaces 23 and 24 of the capacitor 22. However, the middle portions 30 and 34 may also be connected to the first and second terminal electrodes 25 and 26, respectively, at the bottom surface of the capacitor 22.

As shown clearly in FIGS. 1 and 2(C), the first and second leg portions 28 and 29 of the hot side lead 27 are provided with cylindrical ferrite beads 35 and 36, respectively, through which the leg portions 28 and 29 extend.

In addition, as shown clearly in FIGS. 1 and 2(D), the first leg portion 32 of the ground side lead 31 is provided with a cylindrical ferrite bead 37 through which the first leg portion 32 extends.

Among the above-described ferrite beads 35 to 37, the ferrite bead 37 provided on the first leg portion, that is, the ground side input terminal 32 of the ground side lead 31 is most important. Next, the ferrite bead 35 provided on the hot side input terminal 28 of the hot side lead 27 and the ferrite bead 36 provided on the hot side output terminal 29 of the hot side lead 27 are important in that order. Although not shown in the figure, the ground side output terminal 33 of the ground side lead 31 may also be provided with a ferrite bead.

In addition, as shown clearly in FIGS. 2(B) and 2(C), the second leg portion 29 of the hot side lead 27 is provided with a feedthrough capacitor 38 through which the second leg portion 29 extends. An inner peripheral electrode of the feedthrough capacitor 38 is connected to the second leg portion 29 of the hot side lead 27 by soldering.

As in the present preferred embodiment, it is most important for the feedthrough capacitor 38 to be provided in association with the second leg portion, that is, the hot side output terminal 29 of the hot side lead 27. Although not shown in the figure, the first leg portion, that is, the hot side input terminal 28 of the hot side lead 27 may also be provided with a feedthrough capacitor.

The noise filter 21 further includes a ground side plate 39 made of a conductive material. The ground side plate 39 extends in a direction that is substantially perpendicular to the leg portions 28, 29, 32 and 33 of the leads 27 and 31.

As shown clearly in FIGS. 2(B) and 2(C), an outer peripheral electrode of the feedthrough capacitor 38 is connected to the ground side plate 39 by soldering.

In addition, as shown clearly in FIGS. 2(B) and 2(D), a second leg portion 33 of the ground side lead 31 is connected to the ground side plate 39 by soldering.

In addition, as shown clearly in FIGS. 2(C) and 2(D), the first leg portion 28 of the hot side lead 27 and the first leg portion 32 of the ground side lead 31 are electrically insulated from the ground side plate 39.

A shield plate 40 made of a conductive material is connected to the ground side plate 39 so as to extend perpendicularly to the ground side plate 39. As shown clearly in FIGS. 2(C) and 2(D), the shield plate 40 is positioned between the first and second leg portions, that is, the input and output terminals 28 and 29 of the hot side lead 27, and between the first and second leg portions, that is, the input and output terminals 32 and 33 of the ground side lead 31.

Two ground side terminals 41 and 42 are provided integrally on the shield plate 40. The ground side terminals 41 and 42 project downward beyond the hot side input terminal 28, the hot side output terminal 29, the ground side input terminal 32, and the ground side output terminal 33.

The noise filter 21 is provided with a resin body 43 made of an insulating resin that is molded so as to fix the above-described capacitor 22, the hot side lead 27, the ground side lead 31, the ferrite beads 35 to 37, the feedthrough capacitor 38, the ground side plate 39, and the shield plate 40 to one another.

Figure 3A:
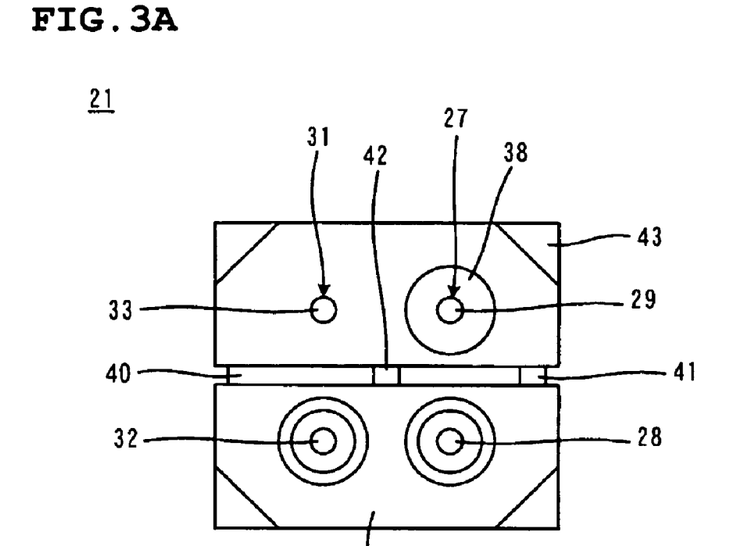
FIG. 3(A) is a bottom view of the noise filter and FIG. 3(B) shows a portion of a circuit board viewed from a side opposite to the side on which the noise filter is mounted.
Figure 3B:
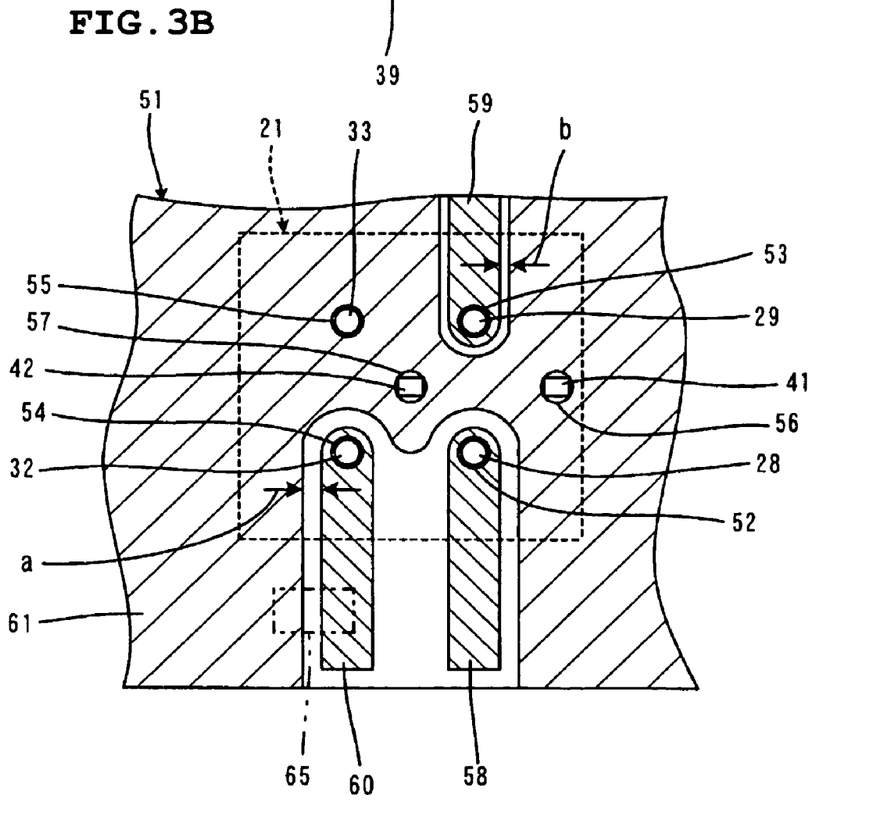

FIGS. 3(A) and 3(B) illustrates the mounting structure of the noise filter 21, where FIG. 3(A) is a bottom view of the noise filter 21 and 3(B) shows a portion of a circuit board 51 on which the noise filter 21 is mounted as viewed from a side opposite to the side on which the noise filter 21 is mounted.

The contour of the noise filter 21 shown in FIG. 3(A) is shown by dashed lines in FIG. 3(B). In addition, FIG. 3(B) shows through holes 52, 53, 54, 55, 56 and 57 that receive the hot side input terminal 28, the hot side output terminal 29, the ground side input terminal 32, the ground side output terminal 33, and the ground side terminals 41 and 42, respectively.

As shown in FIG. 3(B), the circuit board 51 is provided with a hot side input electrode 58 connected to the hot side input terminal 28, a hot side output electrode 59 connected to the hot side output terminal 29, a ground side input electrode 60 connected to the ground side input terminal 32, and a ground side output electrode 61 connected to a ground side output terminal 33 and to the ground side terminals 41 and 42. Preferably, all the electrodes 58, 59, 60, and 61 are formed as wiring patterns on the circuit board 51.

Figure 4:
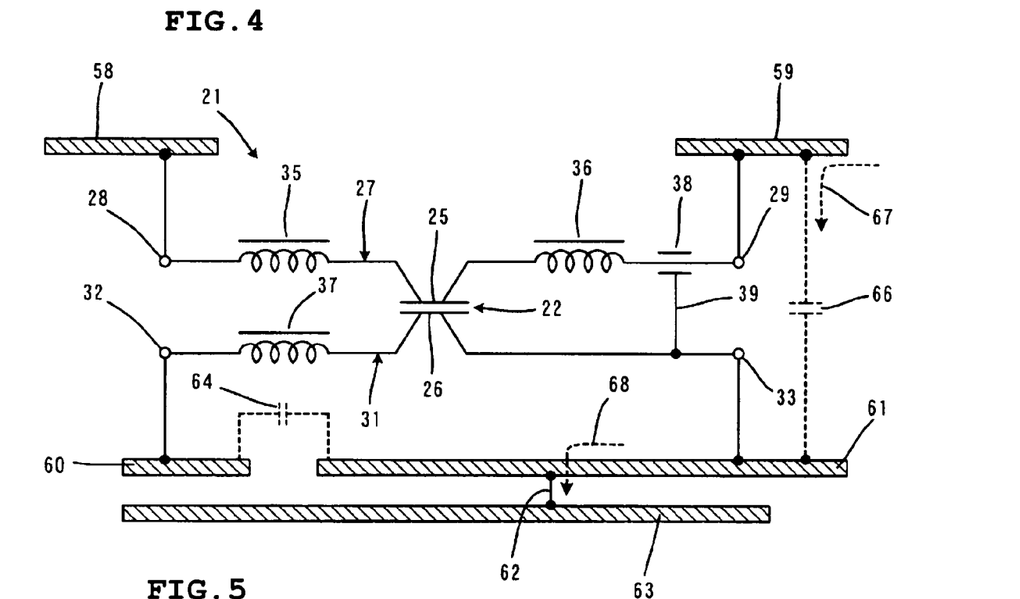
FIG. 4 is a schematic diagram illustrating an equivalent circuit of the noise filter and the manner in which hot side electrodes and ground side electrodes of a circuit board are connected when the noise filter is mounted on the circuit board.

FIG. 4 is a schematic diagram showing a view similar that of FIG. 7 and illustrating an equivalent circuit of the noise filter 21 and the manner in which the hot side electrodes and the ground side electrodes of the circuit board 51 are connected when the noise filter 21 is mounted on the circuit board 51. In FIG. 4, elements corresponding to those shown in FIGS. 1 to 3 are denoted by the same reference numerals in order to clarify the correspondence between the elements shown in FIG. 4 and those shown in FIGS. 1 to 3.

FIG. 4 schematically illustrates a chassis 63 made of metal to which the circuit board 51 is attached with a metal screw 62. The ground side output electrode 61 provided on the circuit board 51 is electrically connected to the chassis 63 by the metal screw 62.

The mounting structure of the above-described noise filter 21 includes an impedance increaser for increasing the impedance of the ground side input terminal 32 seen from the ground side output electrode 61, i.e. the impedance between the ground side input terminal 32 and the ground side output electrode 61, to be larger than both the impedance of the ground side output terminal 33 seen from the ground side output electrode 61, i.e. the impedance between the ground side output terminal 33 and the ground side output electrode 61, and the impedance of the hot side output terminal 29 seen from the ground side output electrode 61, i.e. the impedance between the hot side output terminal 29 and the ground side output electrode 61.

In the present preferred embodiment, the impedance increaser includes a structure for reducing a stray capacitance 64 shown by the dashed lines in FIG. 4 that is formed between the ground side input electrode 60 and the ground side output electrode 61 and increasing a stray capacitance 66 shown by the dashed lines in FIG. 4 that is formed between the hot side output electrode 59 and the ground side output electrode 61. More specifically, the structure for reducing the stray capacitance 64 and increasing the stray capacitance 66 may be provided as described below.

As shown in FIG. 3(B), to increase the noise reduction effect of the noise filter 21, the area of the ground side output electrode 61 on the circuit board 51 is as large as possible. However, a gap a between the ground side input electrode 60 and the ground side output electrode 61 is relatively large, and is larger than a gap b between the ground side output electrode 61 and the hot side output electrode 59.

The stray capacitance 64 can be reduced by increasing the gap a as described above, and accordingly the impedance of the ground side input terminal 32 seen from the ground side output electrode 61 can be increased. Therefore, the noise signal transmitted from the ground side output terminal 33 to the ground side output electrode 61 is grounded and prevented from being transmitted to the ground side input terminal 32 via the stray capacitance 64 and the ground side input electrode 60.

In addition, the stray capacitance 66 can be increased by reducing the gap b. As a result, the noise signal generated at the hot side output electrode 59 is prevented from being transmitted to the ground side output terminal 33 via the capacitor 22 but is grounded to the ground side output electrode 61, as shown by the dashed arrow 67, and is then transmitted to the chassis 63 via the ground side output electrode 61 and the metal screw 62, as shown by the dashed arrow 68.

Accordingly, the noise-reducing characteristics of the noise filter 21 can be improved.

Figure 5:
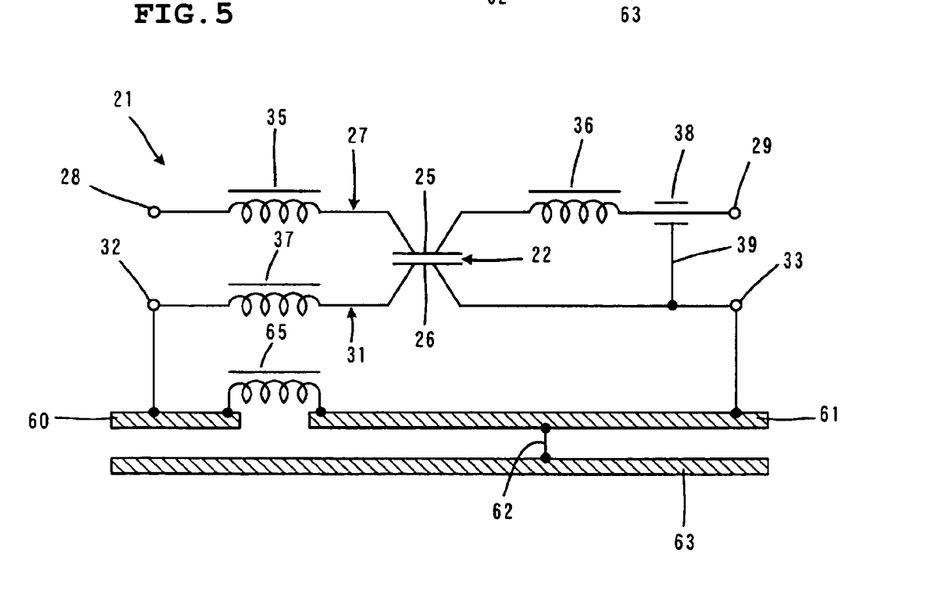
FIG. 5 is a diagram corresponding to FIG. 4 that illustrates a second preferred embodiment of the present invention.

FIG. 5 is a diagram corresponding to FIG. 4 that illustrates a second preferred embodiment of the present invention. In FIG. 5, elements corresponding to the elements shown in FIG. 4 are denoted by the same reference numerals, and redundant explanations thereof are omitted. In addition, FIG. 3 is also referred to for explaining the second preferred embodiment.

The second preferred embodiment includes an inductor 65 connected between the ground side input electrode 60 and the ground side output electrode 61 as an impedance increaser. The inductor 65 may be a chip inductor mounted at a position shown by two-dot chain lines in FIG. 3(B).

Instead of using the chip inductor as described above, the inductor 65 may also be provided by changing the pattern of the ground side input electrode 60 so as to increase the inductance. Alternatively, the area of the ground side output electrode 61 may be increased to reduce the inductance thereof, so that the impedance of the ground side input terminal 32 seen from the ground side output electrode 61 becomes larger than both the impedance of the ground side output terminal 33 seen from the ground side output electrode 61 and the impedance of the hot side output terminal 29 seen from the ground side output electrode 61.

Although the inductor 65, which corresponds to the second preferred embodiment, is shown in FIG. 3(B) that shows structure of the first preferred embodiment, the second preferred embodiment may either be applied in place of or in addition to the first preferred embodiment.

The present invention may be applied when a noise filter including a four-terminal capacitor functioning as an EMI suppression filter is mounted on a circuit board for reducing noise in a DC power line in a large display or the like.

While preferred embodiments of the present invention have been described above, it is to be understood that variations and modifications will be apparent to those skilled in the art without departing the scope and spirit of the invention. The scope of the invention, therefore, is to be determined solely by the following claims.

The invention claimed is:

1. A mounting structure comprising:
a noise filter including a capacitor having a hot side input terminal, a hot side output terminal, a ground side input terminal, and a ground side output terminal;
a circuit board including a hot side input electrode connected to the hot side input terminal, a hot side output electrode connected to the hot side output terminal, a ground side input electrode connected to the ground side input terminal, and a ground side output electrode connected to the ground side output terminal; and
an impedance increaser arranged to increase the impedance of the ground side input terminal seen from the ground side output electrode to be larger than the impedance of the ground side output terminal seen from the ground side output electrode such that a noise signal transmitted from the ground side output terminal to the ground side output electrode is grounded and is prevented from being transmitted to the ground side input terminal via the ground side input electrode, and to increase the impedance of the ground side input terminal seen from the ground side output electrode to be larger than the impedance of the hot side output terminal seen from the ground side output electrode such that a noise signal generated at the hot side output electrode is grounded to the ground side output electrode via a stray capacitance between the hot side output electrode and the ground side output electrode.

2. The mounting structure according to claim 1, wherein the impedance increaser includes a gap between the ground side input electrode and the ground side output electrode larger than a gap between the ground side output electrode and the hot side output electrode so as to reduce a stray capacitance between the ground side input electrode and the ground side output electrode.

3. The mounting structure according to claim 2, wherein the impedance increaser further includes an inductor connected between the ground side input electrode and the ground side output electrode.

4. The mounting structure according to claim 2, further comprising a feedthrough capacitor associated with the hot side output terminal.

5. The mounting structure according to claim 1, wherein the impedance increaser includes an inductor connected between the ground side input electrode and the ground side output electrode.

6. The mounting structure according to claim 5, further comprising a feedthrough capacitor associated with the hot side output terminal.

7. The mounting structure according to claim 1, wherein the noise filter includes a hot side lead that is bent in a U shape such that first and second leg portions extend substantially parallel to each other and a middle portion connects the first and second leg portions at one end thereof, the first and second leg portions serving as the hot side input terminal and the hot side output terminal, respectively.

8. The mounting structure according to claim 7, wherein the noise filter includes a ground side lead that is bent in a U shape such that first and second leg portions extend substantially parallel to each other and a middle portion connects the first and second leg portions at one end thereof, the first and second leg portions serving as the ground side input terminal and the ground side output terminal, respectively.

9. The mounting structure according to claim 8, wherein the capacitor includes first and second terminal electrodes that face each other, the hot side lead being connected to the first terminal electrode at the middle portion of the hot side lead and the ground side lead being connected to the second terminal electrode at the middle portion of the ground side lead.

10. The mounting structure according to claim 1, further comprising a ferrite bead associated with the ground side input terminal.

11. The mounting structure according to claim 10, further comprising a ferrite bead associated with at least one of the hot side input terminal and the hot side output terminal.

12. The mounting structure according to claim 1, further comprising a feedthrough capacitor associated with the hot side output terminal.

* * * * *